United States Patent
Maeyama et al.

(10) Patent No.: US 12,363,927 B2
(45) Date of Patent: Jul. 15, 2025

(54) WIDE GAP SEMICONDUCTOR DEVICE

(71) Applicant: SHINDENGEN ELECTRIC MANUFACTURING CO., LTD., Tokyo (JP)

(72) Inventors: Yusuke Maeyama, Saitama (JP); Shunichi Nakamura, Saitama (JP); Jin Onuki, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 441 days.

(21) Appl. No.: 18/008,657

(22) PCT Filed: Aug. 25, 2021

(86) PCT No.: PCT/JP2021/031066
§ 371 (c)(1),
(2) Date: Dec. 6, 2022

(87) PCT Pub. No.: WO2022/045160
PCT Pub. Date: Mar. 3, 2022

(65) Prior Publication Data
US 2023/0246111 A1    Aug. 3, 2023

(30) Foreign Application Priority Data
Aug. 27, 2020 (JP) .................. 2020-143284

(51) Int. Cl.
*H10D 8/60* (2025.01)
*H10D 64/64* (2025.01)

(52) U.S. Cl.
CPC ............ *H10D 8/60* (2025.01); *H10D 64/64* (2025.01)

(58) Field of Classification Search
CPC ................. H10D 8/60; H10D 64/64
(Continued)

(56) References Cited

U.S. PATENT DOCUMENTS

| | | | | |
|---|---|---|---|---|
| 6,080,599 A * | 6/2000 | Yamamoto | ........... | H10H 20/819 |
| | | | | 438/33 |
| 2010/0096666 A1* | 4/2010 | Ishida | .................... | H10B 51/00 |
| | | | | 257/190 |

(Continued)

FOREIGN PATENT DOCUMENTS

| JP | 2000101100 A | 4/2000 |
|---|---|---|
| JP | 2008072146 A | 3/2008 |

(Continued)

OTHER PUBLICATIONS

International Search Report (ISR) dated Oct. 19, 2021 for International Application No. PCT/JP2021/031066.
(Continued)

*Primary Examiner* — Monica D Harrison
(74) *Attorney, Agent, or Firm* — Ladas & Parry, LLP (57) ABSTRACT

A wide gap semiconductor device has a wide gap semiconductor layer 10; and a metal electrode 20 disposed on the wide gap semiconductor layer 10. The metal electrode 20 has a monocrystalline layer 21 having a hexagonal close-packed (HCP) structure in an interface region between the metal electrode 20 and the wide gap semiconductor layer 10. The monocrystalline layer 21 has a specific element-containing region 22 containing O, S, P or Se.

8 Claims, 12 Drawing Sheets

(58) Field of Classification Search
USPC .......................................................... 257/77
See application file for complete search history.

(56) References Cited

U.S. PATENT DOCUMENTS

| | | | |
|---|---|---|---|
| 2010/0244049 | A1 | 9/2010 | Yamamoto et al. |
| 2011/0204383 | A1 | 8/2011 | Yamamoto et al. |
| 2014/0061670 | A1 | 3/2014 | Wada et al. |
| 2015/0270353 | A1 | 9/2015 | Shimizu et al. |
| 2016/0225891 | A1 | 8/2016 | Hiyoshi et al. |
| 2017/0200787 | A1 | 7/2017 | Shimizu |
| 2017/0365520 | A1* | 12/2017 | Prechtl ................. H10D 30/015 |
| 2019/0109005 | A1 | 4/2019 | Ichikawa |

FOREIGN PATENT DOCUMENTS

| | | |
|---|---|---|
| JP | 2010225877 A | 10/2010 |
| JP | 2011176015 A | 9/2011 |
| JP | 2014053393 A | 3/2014 |
| JP | 2015056543 A | 3/2015 |
| JP | 2015185617 A | 10/2015 |

OTHER PUBLICATIONS

Written Opinion of the International Searching Authority in International Application No. PCT/JP21/031066 dated Oct. 19, 2021 with English translation provided by Google Translate.
"Schottky Barrier Height Modulation of the Metal/4H-SiC Contact by Ultra-Thin Dielectric Insertion Technique," Bing-Yue Tsui et al., Extended Abstracts of the 2013 International Conference on Solid State Devices and Materials, Fukuoka, 2013, pp. 468-469.
Extended European Search Report for the corresponding European Patent Application 21861584.7 issued by the European Patent Office Aug. 7, 2024.

* cited by examiner

WIDE GAP SEMICONDUCTOR DEVICE

CROSS-REFERENCE TO RELATED APPLICATIONS

The present application is the U.S. national phase of PCT Application No. PCT/JP2021/031066 filed on Aug. 25, 2021, which claims priority to Japanese Patent Application No. 2020-143284 filed in Japan on Aug. 27, 2020, the disclosures of which are incorporated herein by reference in their entireties.

TECHNICAL FIELD

The present invention relates to a wide gap semiconductor device having a wide gap semiconductor layer and a metal electrode disposed on the wide gap semiconductor layer.

BACKGROUND ART

In the related art, there is known a wide gap semiconductor device employing SiC or the like (see, for example, JP 2015-56543 A). A wide gap semiconductor device has a need to decrease a turn-on voltage of an SBD. Since a turn-on voltage of an SBD is mostly attributed to a built-in voltage derived from a Schottky junction, a decrease in $\varphi B$ (Schottky barrier height) enables effective reduction of the turn-on voltage.

For example, citing SiC as a wide gap semiconductor device, $\varphi B$ of an N-type SiC-SBD (Schottky barrier diode) is typically controlled by a Schottky electrode, and Ti, Ni, Pt, and the like are used as the Schottky electrode of the N-type SiC-SBD. Among these metals, Ti is known to have the smallest $\varphi B$, and most of commercially available N-type SiC-SBDs use Ti as a Schottky electrode.

SUMMARY OF INVENTION

Problem to be Solved by Invention

With reference to Non-Patent Document (Extended Abstracts of the 2013 International Conference on Solid State Devices and Materials, Fukuoka, 2013, pp 468-469), the inventors of this application have studied a configuration having a $TiO_2$ layer at an interface as a technique for reducing $\varphi B$ and have found that such a configuration is impractical due to an abnormal leakage current, that is, a current value becomes larger than a theoretically expected value in a low voltage range of a forward voltage.

In view of the problem, the present invention provides a wide gap semiconductor device capable of reducing $\varphi B$ without causing an abnormal leakage current.

Means for Solving Problem

A wide gap semiconductor device according to the present invention may comprise:
a wide gap semiconductor layer; and
a metal electrode disposed on the wide gap semiconductor layer,
wherein the metal electrode has a monocrystalline layer having a hexagonal close-packed (HCP) structure in an interface region between the metal electrode and the wide gap semiconductor layer, and
wherein the monocrystalline layer has a specific element-containing region containing O, S, P or Se.

In the wide gap semiconductor device according to the present invention,
the metal electrode may be Ti, Cd, Hf, Mg, Zr or Sc,
the specific element-containing region may contain O, S, P or Se in a case where the metal electrode is Ti, and
the specific element-containing region may contain O in a case where the metal electrode is Cd, Hf, Mg, Zr or Sc.

In the wide gap semiconductor device according to the present invention,
a total atomic concentration of O, S, P and Se in the specific element-containing region may be 7% to 33%.

In the wide gap semiconductor device according to the present invention,
the specific element-containing region may be located within a distance from 11 nm to 37 nm in a thickness direction from an interface between the metal electrode and the wide gap semiconductor layer.

In the wide gap semiconductor device according to the present invention,
specific element-containing regions may be scattered like islands in an in-plane direction.

In the wide gap semiconductor device according to the present invention,
the specific element-containing region may be a high concentration specific element-containing region, and
the metal electrode may have a low concentration specific element-containing region which is disposed on the high concentration specific element-containing region opposite the wide gap semiconductor layer and which has a lower oxygen concentration than an oxygen concentration in the interface region.

In the wide gap semiconductor device according to the present invention,
the metal electrode may have a polycrystalline layer on a side opposite the wide gap semiconductor layer.

In the wide gap semiconductor device according to the present invention,
the metal electrode may have a hydrogen-containing region on a side opposite the wide gap semiconductor layer.

Effect of Invention

It is possible to reduce $\varphi B$ without causing an abnormal leakage current, when an aspect where the metal electrode has the monocrystalline layer having the hexagonal close-packed (HCP) structure in the interface region between the metal electrode and the wide gap semiconductor layer and the monocrystalline layer has the specific element-containing region containing O, S, P, or Se is employed in the present invention.

EMBODIMENT OF INVENTION

First Embodiment

<<Configuration>>

Figure 1:
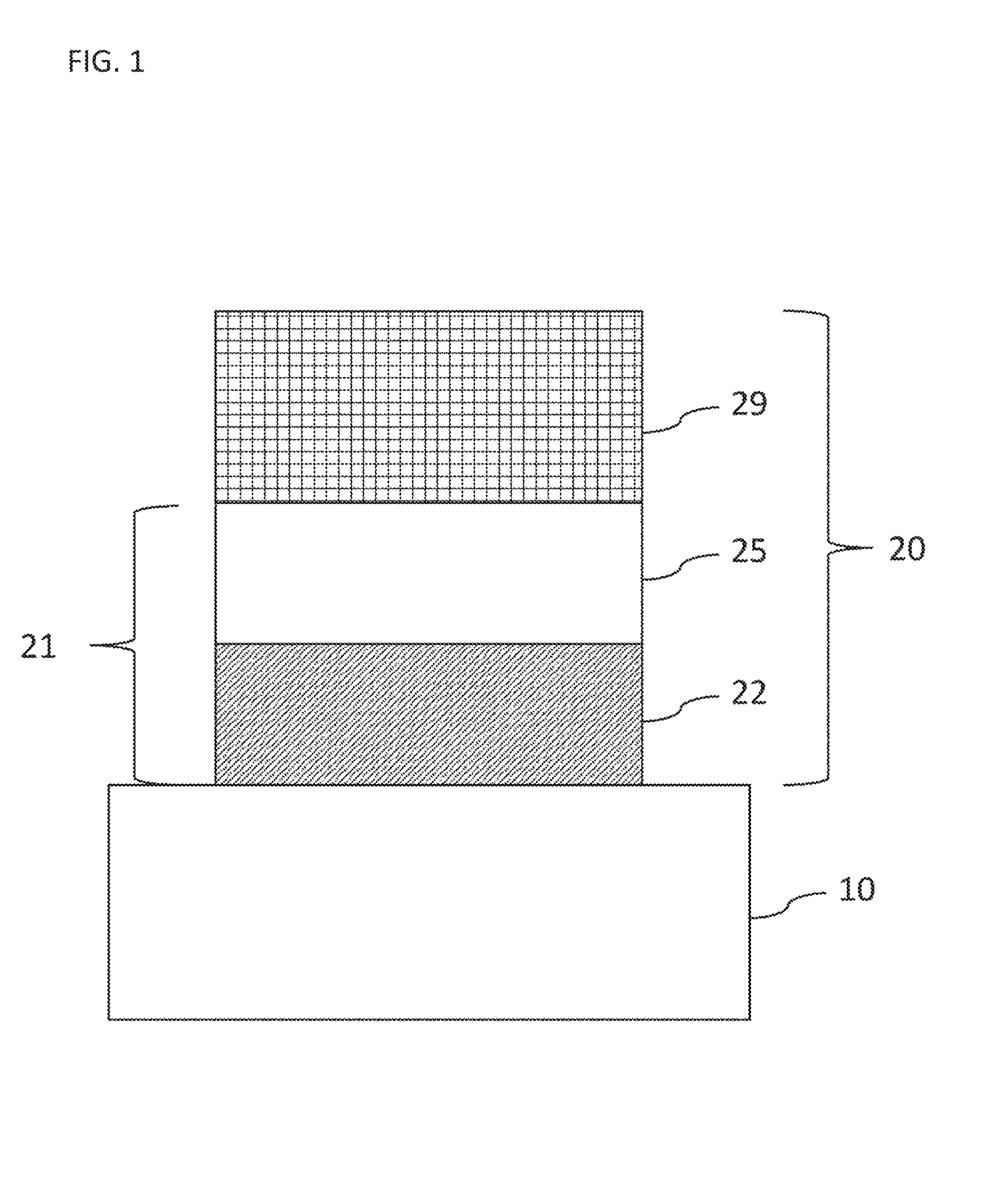
FIG. 1 is a longitudinal sectional view showing a wide gap semiconductor device according to a first embodiment of the invention.

As shown in FIG. 1, a wide gap semiconductor device according to this embodiment has a wide gap semiconductor layer 10 and a metal electrode 20 disposed on the wide gap semiconductor layer 10. The metal electrode 20 may have a monocrystalline layer 21 having a hexagonal close-packed (HCP) structure in an interface region between the metal electrode 20 and the wide gap semiconductor layer 10 (on the back side of the metal electrode 20). The monocrystalline layer 21 may have a specific element-containing region 22 containing oxygen (O), sulfur (S), phosphorus (P), or selenium (Se) in the interface region between the metal electrode 20 and the wide gap semiconductor layer 10. One or more elements of O, S, P, and Se, but typically O, can be included in the specific element-containing region 22. Examples of the wide gap semiconductor include SiC and GaN. The upper side of FIG. 1 is the front side of the wide gap semiconductor device, and the lower side is the back side of the wide gap semiconductor device. The metal electrode 20 of this embodiment constitutes a Schottky electrode.

In an aspect, the monocrystalline layer 21 may be titanium (Ti), cadmium (Cd), hafnium (Hf), magnesium (Mg), zirconium (Zr), or scandium (Sc) or may contain two or more of these metals. Among these metals, Ti is typically used, and hereinafter mainly described is an aspect in which Ti is used. Note that Cd, Hf, Mg, Zr, and Sc derive results similar to Ti because those metals have a hexagonal close-packed (HCP) crystal structure and a lattice constant close to that of SiC.

In a case where the monocrystalline layer 21 is Ti, the specific element-containing region 22 of the monocrystalline layer 21 may contain O, S, P, or Se. In a case where the monocrystalline layer 21 is Cd, Hf, Mg, Zr, or Sc, the specific element-containing region 22 of the monocrystalline layer 21 may contain O.

A total atomic concentration of O, S, P, and Se in the specific element-containing region 22 may be 7% to 33%. The atomic concentration herein is "total concentration." In a case where the specific element-containing region 22 includes two or more of O, S, P, and Se, a total atomic concentration of the elements is 7% to 33%. In a case where the specific element-containing region 22 includes one of O, S, P, and Se, an atomic concentration of the element is 7% to 33%. Among O, S, P, and Se, O is typically used, and hereinafter mainly described is a case where O is used. The theoretical upper limit of concentration of atoms such as O, S, P, and Se which can be inserted while maintaining an HCP structure is 33%. This is why the upper limit of atomic concentration is set to 33%. As long as the HCP structure is maintained, no abnormal leakage current occurs. In contrast, when an impurity concentration is 33% or more as in $TiO_2$ employed in the above Non-Patent Document, it is difficult for the monocrystalline layer 21 to maintain its original hexagonal close-packed (HCP) crystal structure, which causes an abnormal leakage current.

Similarly to O, results of first-principle calculation show that S, P, and Se are all chemically bonded to Ti or the like and that, in a case where those elements have an identical structure, a relatively large number of valence electrons causes an increase in Fermi energy. Accordingly, S, P, and Se all derive results similar to O. For example, comparing $Ti_6O$ and $Ti_2S$, assuming that $Ti_6O$ and $Ti_2S$ have an identical structure, $Ti_2S$ is higher in Fermi energy because the number of valence electrons is relatively larger. Even in a case where $Ti_6O$ and $Ti_2S$ do not have an identical structures, it is possible to obtain a similar effect as long as $Ti_6O$ and $Ti_2S$ stably have similar structures.

The specific element-containing region 22 may be located within a distance from 11 nm to 37 nm in a thickness direction from an interface between the metal electrode 20 and the wide gap semiconductor layer 10. In an aspect shown in FIG. 1, the specific element-containing region 22 may have a thickness of from 11 nm to 37 nm from the interface between the metal electrode 20 and the wide gap semiconductor layer 10. The specific element-containing region 22 contains a significant amount of any of O, S, P, and Se in an atomic state, typically having an atomic concentration of 5% or more.

Unlike the following second embodiment, the specific element-containing region 22 may be disposed over the entire surface in the in-plane direction.

The metal electrode 20 may have a polycrystalline layer 29 on the front side opposite the wide gap semiconductor layer 10. Between the specific element-containing region 22 and the polycrystalline layer 29, there may be disposed a monocrystalline main layer 25 which contains no specific element or a small amount of specific elements as compared with the specific element-containing region 22. The monocrystalline main layer 25 and the specific element-containing region 22 may constitute the monocrystalline layer 21.

The specific element-containing region 22 may be a high concentration specific element-containing region. The metal electrode 20 may have a low concentration specific element-containing region which is disposed on a side of the high concentration specific element-containing region opposite the wide gap semiconductor layer 10 (the upper side in FIG. 1) and which has a lower oxygen concentration than the oxygen concentration in the interface region. In an aspect of this embodiment, the monocrystalline main layer 25 has a low concentration specific element-containing region.

The metal electrode 20 may have a hydrogen-containing region on a side opposite the wide gap semiconductor layer 10. The polycrystalline layer 29 may have a hydrogen-containing region, and in this case, the hydrogen-containing region is disposed inside the polycrystalline layer 29. All or part of the polycrystalline layer 29 may be the hydrogen-containing region. In a case where the metal electrode 20 is Ti, a TiO$_2$-containing layer is disposed on the surface of the metal electrode 20 because Ti is easily oxidized (see FIG. 7B).

Figure 2:
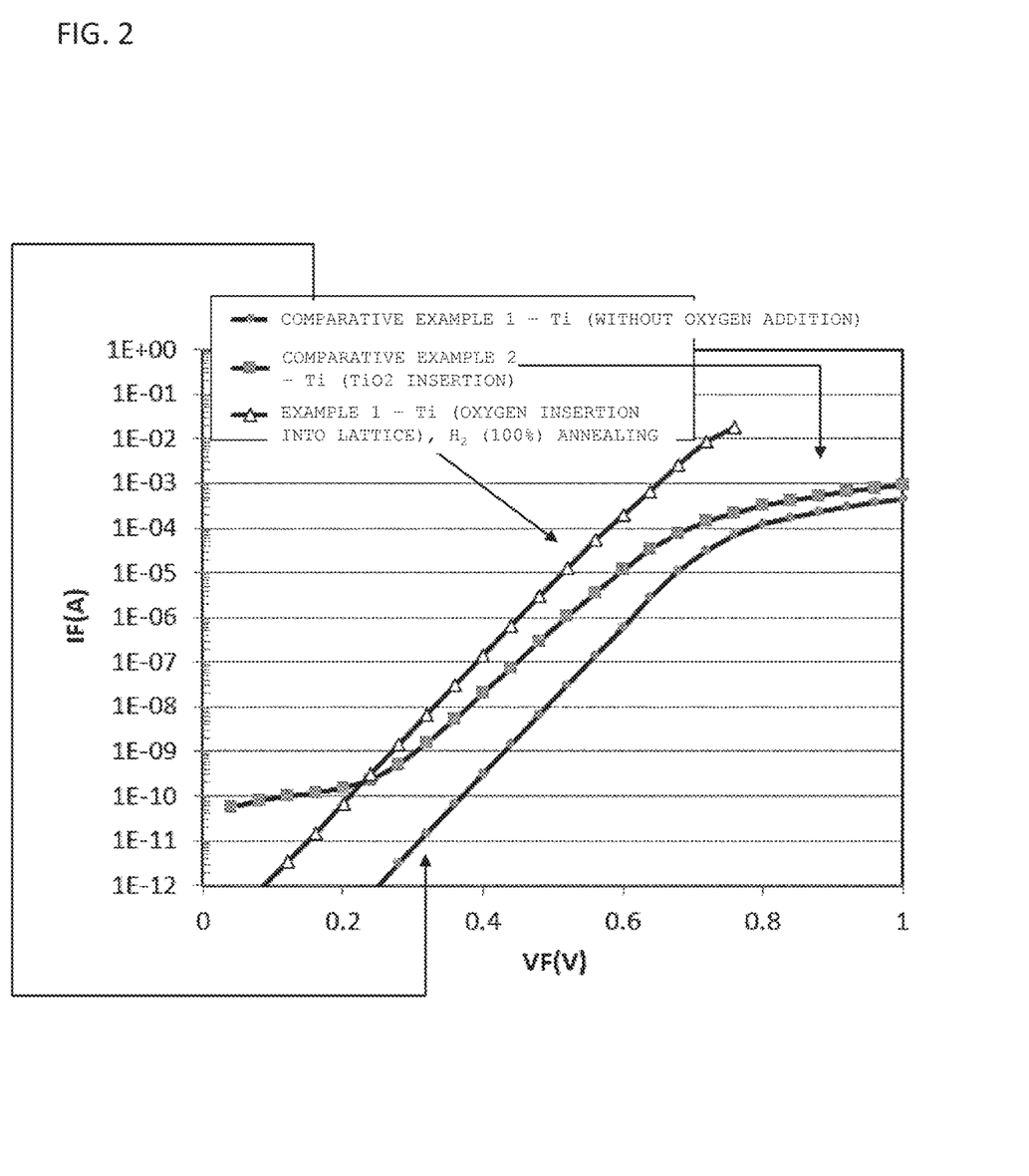
FIG. 2 is a graph showing the relation between VF (V) and IF (A) in Example 1, Comparative Example 1, and Comparative Example 2.

FIG. 2 illustrates I-V waveforms of SiC-SBDs (Schottky barrier diode) using an aspect in which the wide gap semiconductor layer 10 is SiC, the metal electrode 20 is Ti, and the specific element-containing region 22 contains O atoms. Comparative Example 1 shows an aspect in which the specific element-containing region 22 does not contain a significant amount of O atoms, Comparative Example 2 shows an aspect in which the specific element-containing region 22 contains TiO$_2$, and Example 1 shows an aspect in which the specific element-containing region 22 contains a significant amount of O atoms. As can be seen in the aspect of Comparative Example 1, the threshold voltage is high. As can be seen in the aspect of Comparative Example 2, an abnormal leakage current occurs at 0 to 0.2 V. In contrast, in the aspect of Example 1, no abnormal leakage current as in Comparative Example 2 occurs and the threshold voltage can be reduced.

Figure 3:
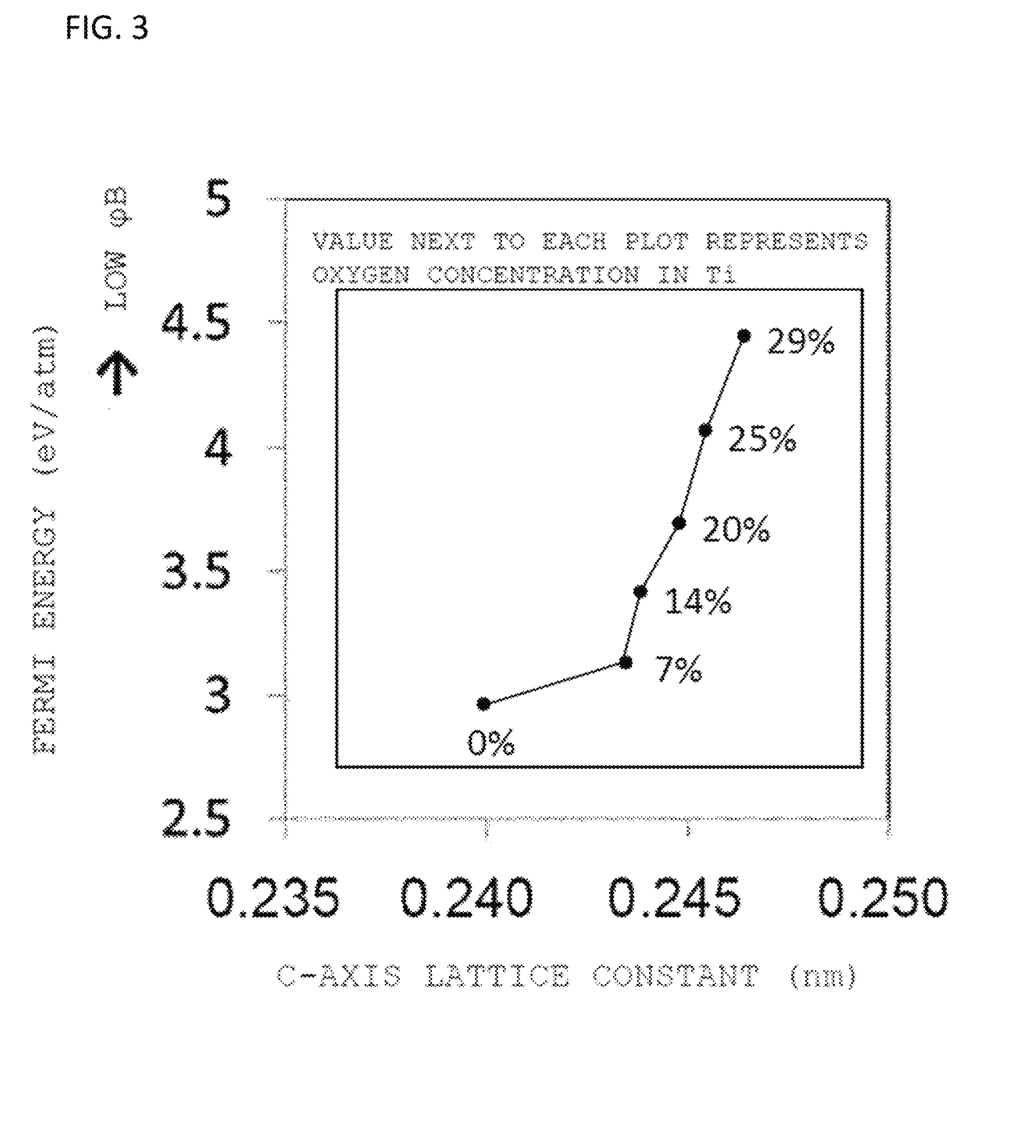
FIG. 3 is a graph showing the relation between C-axis lattice constant (nm) and Fermi energy (eV/atm).

FIG. 3 shows results obtained by the first-principle calculation, showing the relation between lattice constant C-axial length and Fermi energy in an aspect where the wide gap semiconductor layer 10 is SiC, the metal electrode 20 is Ti, the specific element-containing region 22 contains O atoms, and the content of O atoms in the specific element-containing region 22 is increased. It can be confirmed that an increase in concentration of O atoms in an interface region between Ti and SiC increases the Fermi energy and decreases φB (Schottky barrier height).

Figure 4A:
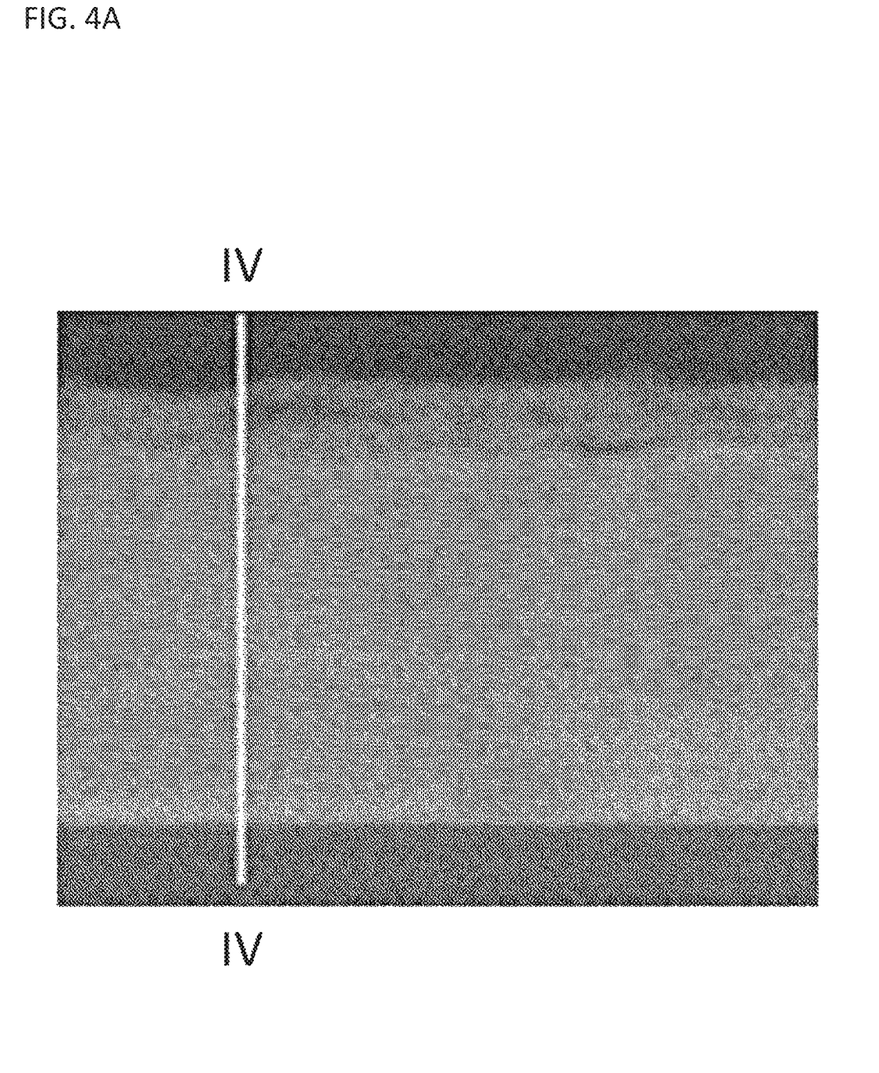
FIG. 4A is an image obtained by capturing a metal electrode in Example of the invention with scanning equivalent electron microscope (STEM).
Figure 4B:
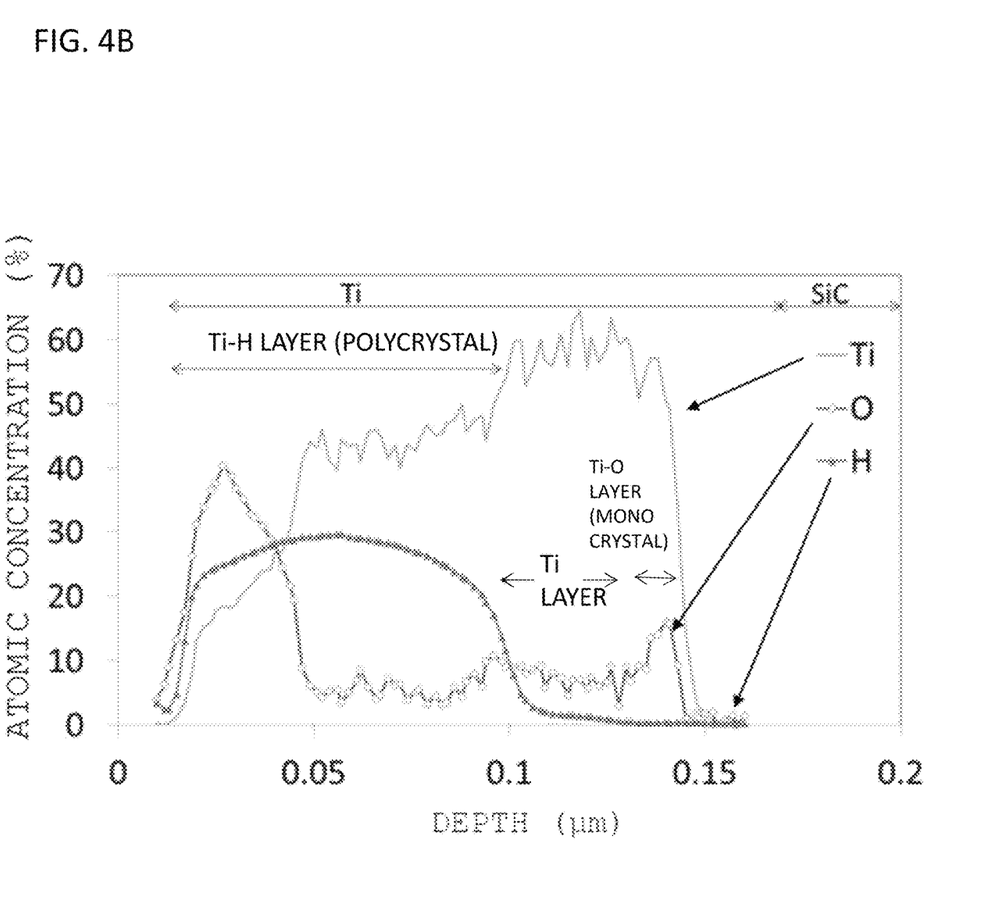
FIG. 4B is a graph showing amounts of Ti, O, and H included in the metal electrode in Example of the invention.

FIGS. 4A and 4B show results of composition analysis on Ti and O performed by energy-dispersive X-ray spectroscopy (EDX) with STEM and results of analysis on H performed with a glow discharge optical emission spectrometer (GD-OES), employing the aspect in which the wide gap semiconductor layer 10 is SiC, the metal electrode 20 is Ti, and the specific element-containing region 22 contains O atoms. A cut line of energy-dispersive X-ray spectroscopy (EDX) is indicated by straight line IV-IV in FIG. 4A. A depth of 0 μm in FIG. 4B is an interface on the front side of the metal electrode 20, and a depth of 0.15 μm is an interface between Ti and SiC.

The following Table 1 shows sites, crystal structures, compositions, and crystal orientations obtained from FIG. 4B. In the aspect shown in FIG. 4B, the specific element-containing region 22 is located within a distance of 30 nm or less in the thickness direction from the interface between the metal electrode 20 and the wide gap semiconductor layer 10, and the hydrogen-containing region is separated from the interface between the metal electrode 20 and the wide gap semiconductor layer 10 by 80 nm or more in the thickness direction.

TABLE 1

| SITE | CRYSTAL STRUCTURE | COMPO-SITION | CRYSTAL ORIENTATION |
| --- | --- | --- | --- |
| SiC LAYER | 4H—SiC | Si, C | 4° |
| Ti—O LAYER (0 TO 30 nm FROM INTERFACE) | MONO-CRYSTALLINE HEXAGONAL CLOSE-PACKED Ti | Ti, O | 3°, 3° |
| Ti—H LAYER (80 nm OR MORE FROM INTERFACE) | POLY-CRYSTALLINE Ti | Ti, H, O | 3°, 11°, 12°, −1°, 3°, −1° |

As shown above, only components having a crystal orientation at "3°" are detected in the Ti—O layer adjacent to the SiC layer. This result shows that O is contained in the monocrystalline hexagonal close-packed Ti. In addition, a plurality of crystal orientations is detected on a side opposite the SiC layer, which shows that polycrystalline Ti is formed and that the polycrystalline Ti contains H. Since Ti is relatively and easily oxidized, Ti is oxidized instantaneously at the time of cross-sectional processing for analysis. Accordingly, the lower limit of O detection in the Ti layer or the metal electrode 20 is about 10%, which is larger than the lower limit of O detection in the SiC layer, which is about 0%. It should be noted that a high oxygen concentration inside Ti in FIG. 4B is caused by the oxidizability of Ti.

Figure 5A:
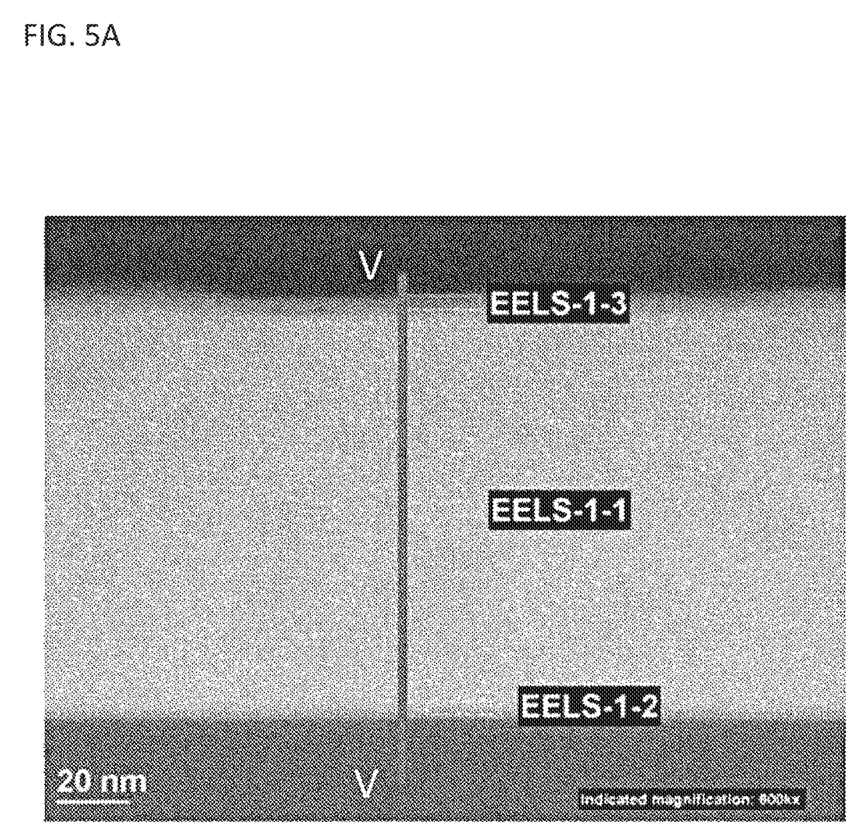
FIG. 5A is an image obtained by capturing a metal electrode in Comparative Example 1 with STEM.
Figure 5B:
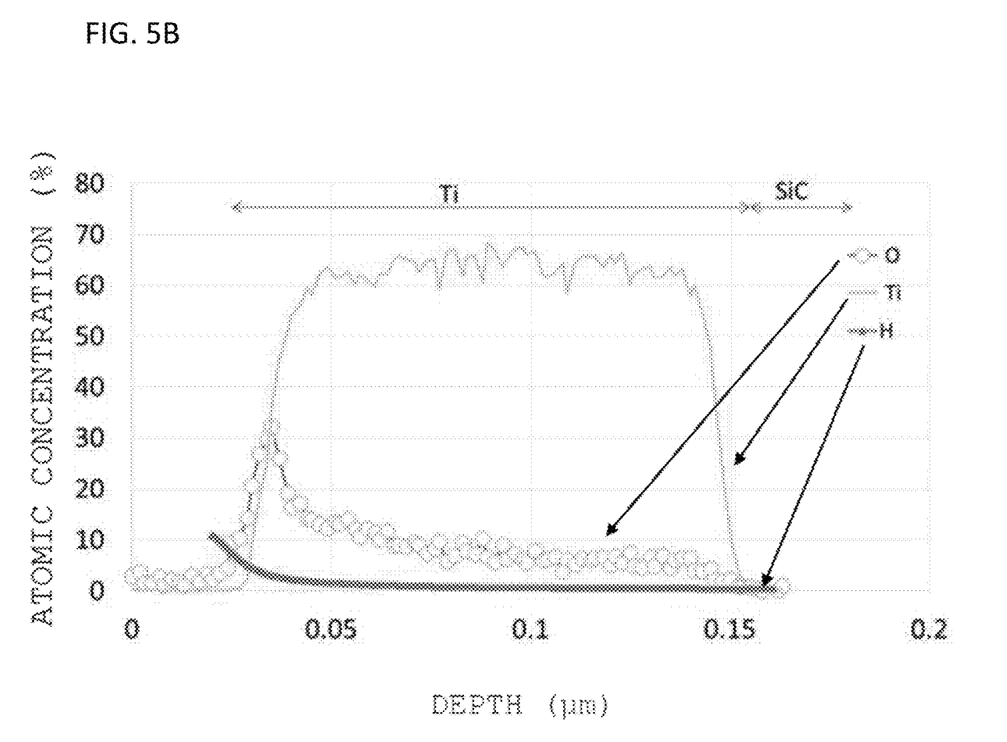
FIG. 5B is a graph showing amounts of Ti, O, and H included in the metal electrode in Comparative Example 1.

FIGS. 5A and 5B illustrate an aspect in which the wide gap semiconductor layer 10 is SiC and the metal electrode 20 is Ti without the specific element-containing region 22 (Comparative Example 1). FIG. 5A corresponds to FIG. 4A, and FIG. 5B corresponds to FIG. 4B. A cut line of energy-dispersive X-ray spectroscopy (EDX) is indicated by straight line V-V in FIG. 5A. Unlike FIG. 4B, no "bump" (see a depth ranging from 0.13 to 0.15 μm in FIG. 4B) having an oxygen concentration corresponding to the Ti—O layer was detected at an interface between a SiC layer and a Ti layer. The oxygen concentration around the interface between the SiC layer and the Ti layer is 6.6%, which is below about 10%, the lower limit of detection.

Figure 6:
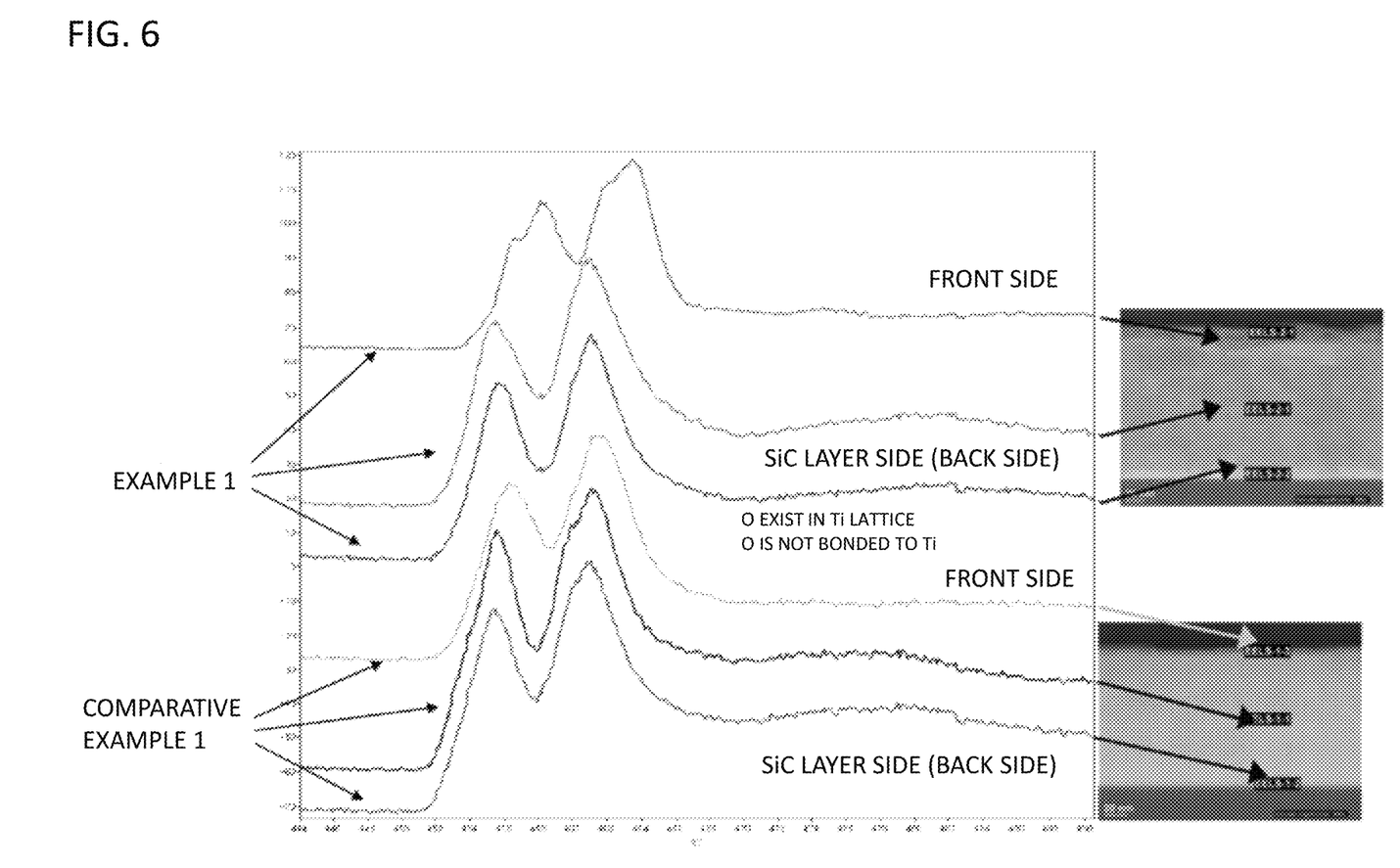
FIG. 6 is a graph showing EELS signal waveforms of Ti in Example 1 and Comparative Example 1 and images captured with STEM.

As shown in FIG. 6, in the aspect of Example 1, the EELS signal waveform of Ti in the Ti—O layer, or the specific element-containing region 22, is similar to the EELS signal waveform of monocrystalline Ti epitaxially grown on SiC in Comparative Example 1. As can be seen from this result, O atoms are in Ti lattice of the Ti—O layer, or the specific element-containing region 22, and Ti and O are not covalently bonded. In Example 1, the oxygen concentration increases to 40% on the front side and Ti and O are covalently bonded, causing a shift in EELS signal waveform. As can be seen from this result, O atoms are in Ti lattice of the Ti—O layer, or the specific element-containing region 22, and Ti and O are not covalently bonded.

<<Manufacturing Method>>

Hereinafter described is an example of a manufacturing method according to an aspect of this embodiment. The manufacturing method will be described using an aspect in which the wide gap semiconductor layer 10 is SiC and the metal electrode 20 is Ti.

Figure 7A:
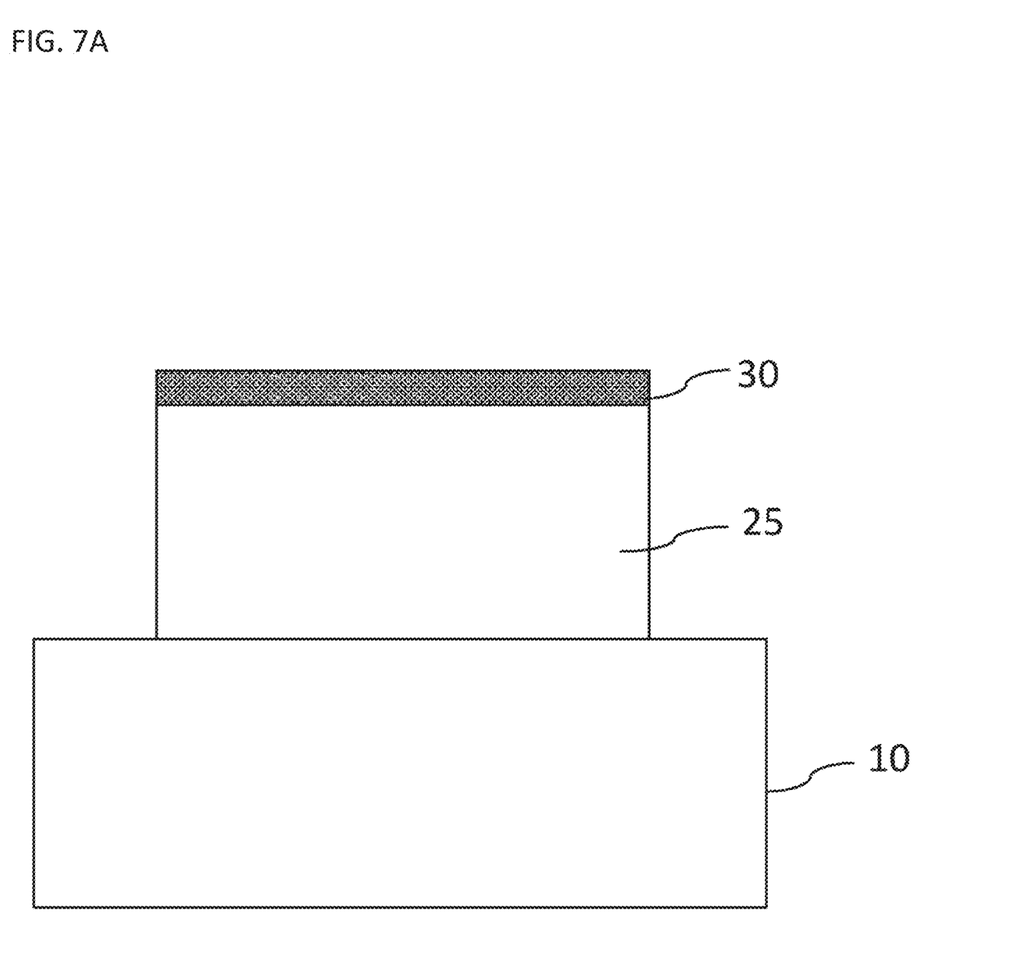
FIG. 7A is a view showing an example of a method for manufacturing a wide gap semiconductor device according to the first embodiment of the invention.
Figure 7B:
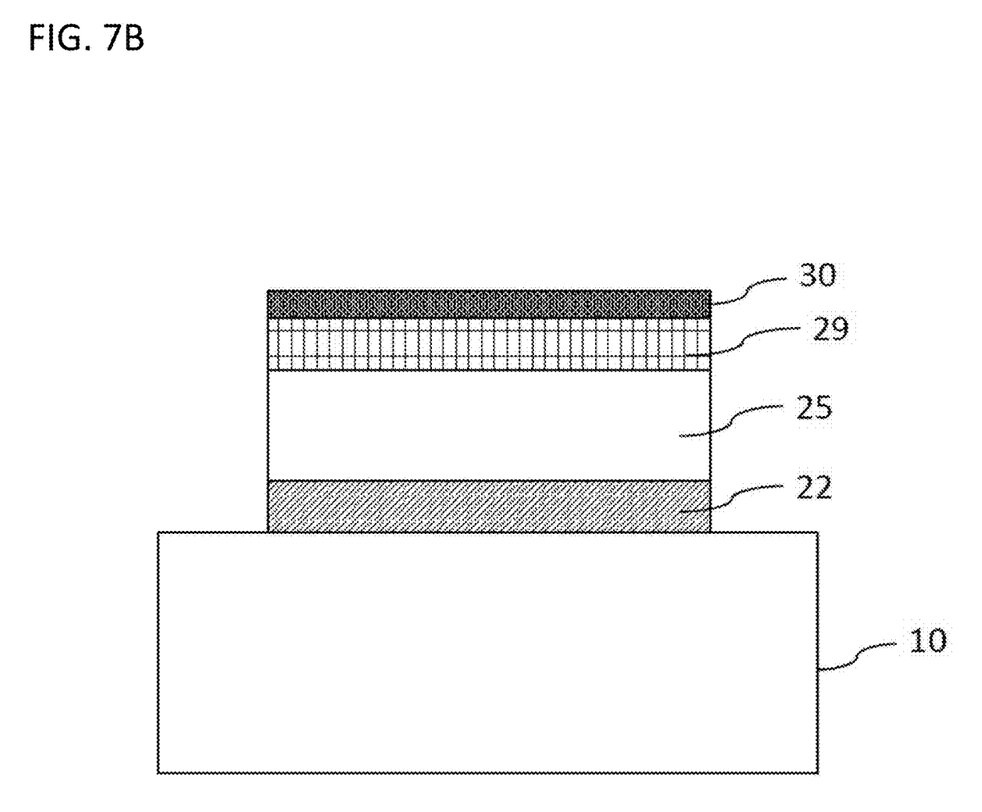
FIG. 7B is a view following FIG. 7A, showing an example of the method for manufacturing a wide gap semiconductor device according to the first embodiment of the invention.

First, the metal electrode 20 being Ti is disposed on the wide gap semiconductor layer 10 which is SiC (see FIG. 7A). Since Ti is easily oxidized, the surface of the metal electrode 20 being Ti comes into contact with oxygen, thereby forming a layer being TiO$_2$ (TiO$_2$ layer) 30.

Next, after vacuum is drawn inside a chamber, H$_2$ gas or H$_2$ gas diluted with Ar (H$_2$ gas flow rate of 1 to 20%) is supplied, followed by annealing at 300 to 600° C. A Ti—H layer is formed on the front side by the supplied H$_2$ gas. Along with the formation of the Ti—H layer, it is believed that oxygen originally included in the metal electrode 20 being Ti is pushed into a Ti/SiC interface to form a Ti—O layer, or the specific element-containing region 22. Furthermore, it is believed that H atoms of the supplied H$_2$ gas penetrate into Ti through defects or the like in the TiO$_2$ layer.

At this time, the surface of Ti is oxidized by residual oxygen and moisture in the chamber. It is believed that oxygen and part of O atoms derived from moisture in the chamber also penetrate into the inside through grain boundaries of polycrystalline Ti on the front side, thereby increasing the Ti—O layer, or the specific element-containing region 22. More specifically, it is believed that oxygen remaining in the chamber is separated into O atoms, enters into the metal electrode 20 being Ti, and oxides the surface of the metal electrode 20 or moves to the Ti/SiC interface to increase the Ti—O layer (indicated by reference numeral 79 in FIG. 7B). In addition, it is believed that moisture ($H_2O$) remaining in the chamber is separated into H and OH, and OH enters the metal electrode 20 being Ti and oxides the surface or moves to the Ti/SiC interface to increase the Ti—O layer 22.

In this manner, there is produced a wide gap semiconductor device having the specific element-containing region 22 being the Ti—O layer at the Ti/SiC interface and having the hydrogen-containing region on the front side.

In Example 1 described above, annealing was performed at 350° C. or higher in the presence of $H_2$ gas.

<<Effects>>

Hereinafter, an effect obtained from this embodiment having the above configuration will be described focusing on those not mentioned yet.

The inventors have found that it is possible to reduce φB without causing an abnormal leakage current in an aspect where the metal electrode 20 has the monocrystalline layer 21 having the hexagonal close-packed (HCP) structure in the interface region between the metal electrode 20 and the wide gap semiconductor layer 10 and the monocrystalline layer 21 has the specific element-containing region 22 containing O, S, P, or Se (see FIG. 2).

In particular, in a case where the metal electrode 20 is Ti and the specific element-containing region 22 contains O, S, P, or Se or in a case where the metal electrode 20 is Cd, Hf, Mg, Zr, or Sc and the specific element-containing region 22 contains O, it is possible to reduce φB more reliably without causing an abnormal leakage current.

In order to obtain the effect of reducing φB more reliably without causing an abnormal leakage current, it is beneficial that the total atomic concentration of O, S, P, and Se in the specific element-containing region 22 is 7% to 33%. This is because introduction of O, S, and P in an amount larger than 33% makes it difficult for the metal electrode 20 to maintain the hexagonal close-packed (HCP) structure and causes an abnormal leakage current.

Second Embodiment

Next, a second embodiment of the invention will be described.

Figure 8:
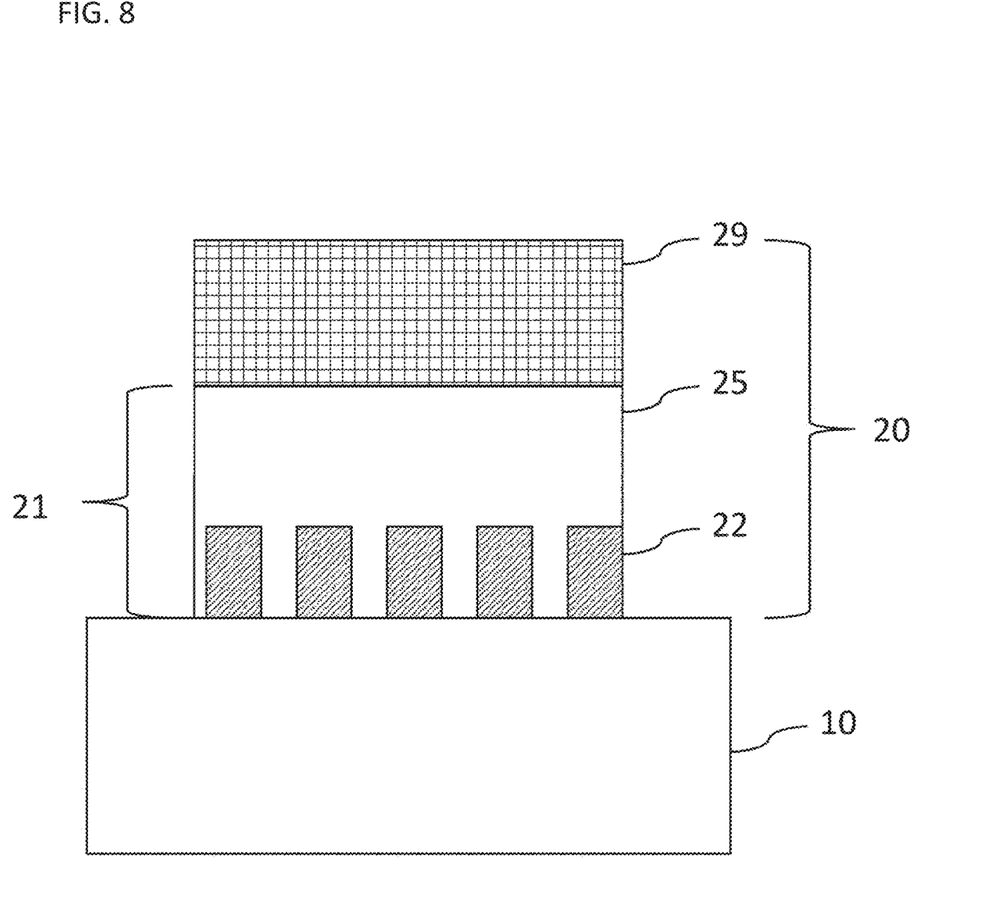
FIG. 8 is a longitudinal sectional view showing a wide gap semiconductor device according to a second embodiment of the invention.
Figure 9:
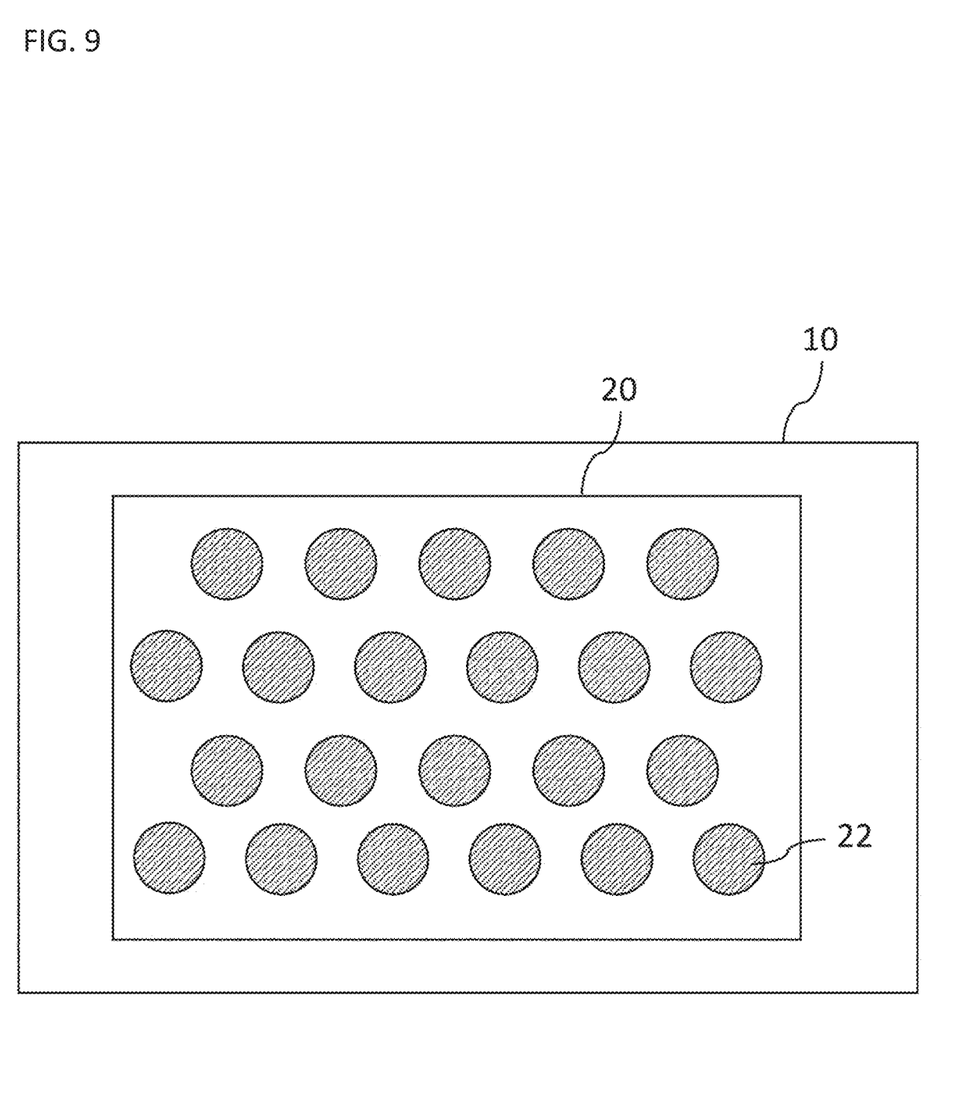
FIG. 9 is a plan view showing specific element-containing regions scattered like islands in the second embodiment of the invention.

In the first embodiment, the specific element-containing region 22 is disposed over the entire surface in the in-plane direction, but the invention is not limited thereto. In an aspect of this embodiment, as shown in FIGS. 8 and 9, specific element-containing regions 22 are scattered like islands in the in-plane direction. It should be noted that in order to show the specific element-containing regions 22 scattered like islands, FIG. 9 shows a plan view of only the specific element-containing regions 22 inside the metal electrode 20. Such island-like specific element-containing regions 22 can be generated by annealing using $H_2$ gas diluted with Ar. In diluting with Ar, $H_2$ does not push oxygen or the like so strongly, which may form the island-like specific element-containing regions 22.

Other configurations are similar to those described in the first embodiment. In the second embodiment, the same or similar members and the like as those in the first embodiment are denoted by the same reference numerals, and the description thereof will be omitted.

According to this embodiment, it is possible to obtain an effect similar to one achieved by the first embodiment. That is, even in an aspect in this embodiment where the specific element-containing regions 22 containing O, S, P, or Se are scattered like islands in the in-plane direction, it is possible to reduce φB without causing an abnormal leakage current when the specific element-containing regions 22 have a total atomic concentration of 7% to 33%.

The description of each embodiment and the disclosure of the figures described above are merely examples for describing the invention described in the claims, and the invention described in the claims is not limited by the description of the embodiments or the disclosure of the figures described above. In addition, the description of the claims as originally filed is merely an example, and the description of the claims can be appropriately changed based on the description of the specification, the figures, and the like.

DESCRIPTION OF REFERENCE NUMERALS

10 Wide gap semiconductor layer
20 Metal electrode
21 Monocrystalline layer
22 Specific element-containing region
25 Monocrystalline main layer
29 Polycrystalline layer
30 layer being $TiO_2$ ($TiO_2$ layer)

The invention claimed is:

1. A wide gap semiconductor device comprising:
a wide gap semiconductor layer; and
a metal electrode disposed on the wide gap semiconductor layer,
wherein the metal electrode has a monocrystalline layer having a hexagonal close-packed (HCP) structure in an interface region between the metal electrode and the wide gap semiconductor layer, and
wherein the monocrystalline layer has a specific element-containing region containing O, S, P or Se.

2. The wide gap semiconductor device according to claim 1,
wherein the metal electrode is Ti, Cd, Hf, Mg, Zr or Sc,
wherein the specific element-containing region contains O, S, P or Se in a case where the metal electrode is Ti, and the specific element-containing region contains O in a case where the metal electrode is Cd, Hf, Mg, Zr or Sc.

3. The wide gap semiconductor device according to claim 1,
wherein a total atomic concentration of O, S, P and Se in the specific element-containing region is 7% to 33%.

4. The wide gap semiconductor device according to claim 1,
wherein the specific element-containing region is located within a distance from 11 nm to 37 nm in a thickness direction from an interface between the metal electrode and the wide gap semiconductor layer.

5. The wide gap semiconductor device according to claim 1,
wherein specific element-containing regions are scattered like islands in an in-plane direction.

6. The wide gap semiconductor device according to claim 1,
wherein the specific element-containing region is a high concentration specific element-containing region, and
wherein the metal electrode has a low concentration specific element-containing region which is disposed on the high concentration specific element-containing region opposite the wide gap semiconductor layer and which has a lower oxygen concentration than an oxygen concentration in the interface region.

7. The wide gap semiconductor device according to claim 1, wherein the metal electrode has a polycrystalline layer on a side opposite the wide gap semiconductor layer.

8. The wide gap semiconductor device according to claim 1, wherein the metal electrode has a hydrogen-containing region on a side opposite the wide gap semiconductor layer.

* * * * *